United States Patent
Taniguchi et al.

(10) Patent No.: US 7,099,091 B2
(45) Date of Patent: Aug. 29, 2006

(54) DISPLAY DEVICE

(75) Inventors: Maki Taniguchi, Ichihara (JP); Tomoji Oishi, Hitachi (JP); Masahiro Nishizawa, Mobara (JP); Shinichi Kato, Mobara (JP); Norikazu Uchiyama, Chikura (JP)

(73) Assignee: Hitachi Displays, Ltd., Mobara (JP)

( * ) Notice: Subject to any disclaimer, the term of this patent is extended or adjusted under 35 U.S.C. 154(b) by 0 days.

(21) Appl. No.: 10/721,427

(22) Filed: Nov. 26, 2003

(65) Prior Publication Data
US 2004/0169936 A1    Sep. 2, 2004

(30) Foreign Application Priority Data
Nov. 26, 2002    (JP)    ............... 2002-342437

(51) Int. Cl.
*G02B 3/00*    (2006.01)
(52) U.S. Cl. ....................... 359/722; 359/609
(58) Field of Classification Search ............... 359/722, 359/13, 242, 609; 349/11, 78–79; 106/31.27, 106/31.57, 218, 236, 241; 264/78; 427/469; 428/1.31

See application file for complete search history.

(56) References Cited

U.S. PATENT DOCUMENTS 6,180,315 B1 *    1/2001    Schadeli et al. ............ 430/200
6,280,511 B1 *    8/2001    Schaedeli et al. ......... 430/137.1

\* cited by examiner

*Primary Examiner*—Jordan M. Schwartz

(74) *Attorney, Agent, or Firm*—Antonelli, Terry, Stout and Kraus, LLP.

(57) ABSTRACT

In a display device comprising an optical region containing a plurality of pigment grains utilized for wavelength selection, anti-reflection, improvement of the light emitting performance and the like, dyestuff molecules utilized for forming the pigment grains to be dissolved in a solvent in which the dyestuff molecules are insoluble originally are chemically modified, and then the solubility of the modified dyestuff molecules in the solvent is reduced by energy transfer thereto to aggregate the dyestuff molecules, so that grain sizes of pigment grains are suitably controlled for the optical region in accordance with its use.

14 Claims, 7 Drawing Sheets

Spectral Change between Soluble Quinacridon and Insoluble Quinacridon

Relationship between Energy Amount and Pigmentation Ratio

Relationship between Pigmentation Ratio and Refractive Index under Oxygen Plasma Irradiation Relationship between Substrate Temperature and Grain Size Absorbance Variation at each Wavelength
Observed for either of Red Dot and Blue Dot

- 450 nm for Red Dot
- 570 nm for Red Dot
- 600 nm for Blue Dot
- 630 nm for Blue Dot Transmission Spectra of Wavelength Selective Absorption Film for CDT

DISPLAY DEVICE

BACKGROUND OF THE INVENTION

The present invention relates to a display device, and, more particularly, the invention relates to a display device having functional films to be provided in various optical elements, such as surface-processed films, colored films, and tint-controlled films, which exhibit improved characteristics.

In various display devices, optical members provided with various functional films are used. Examples include surface coating thin films or tackifiers of surface films in a direct-view cathode ray tube (CRT), a projection tube (PRT), a field emission display (FED), a plasma display panel (PDP), etc., luminescent layers of various optical members constituting illuminating light sources of a liquid crystal display (LCD) or organic electroluminescent display (organic EL display: OLED), and color purity enhancing filters thereof. Various dyes or pigments are used in functional films constituting these optical members.

Dyes or pigments have characteristic features and also defects. That is, since dyes are readily soluble in solvents and are easy to handle, they are easy with respect to addition and processing as a functional material. However, the dyes are liable to cause dissolution or bleeding due to external causes and are also poor in light fastness. On the other hand, since the pigments are only sparingly soluble in solvents, they are free from the foregoing dissolution or bleeding and have good light fastness. However, for the sake of obtaining optical functional films (optical thin films) having good characteristics, in pigments, it is difficult to ultrafinely granulate or highly disperse them and to make the grain size distribution uniform and maintain stability.

In display devices requiring light fastness, a thin film using an organic pigment is used. However, because of the foregoing problems, there are involved problems in that scattering occurs to some extent, and that when formed into a thin film, a reduction in strength occurs. Also, in applications requiring high design precision, such as a diffusing plate or a light guiding plate and a micro lens (prism sheet), it was difficult to use an organic pigment that exhibits difficulties in precisely controlling the grain size.

For the sake of solving the problems caused due to dispersibility of a pigment, a structured dyestuff as proposed in the below-listed Patent Document 1 constitutes a material having solvent solubility as in dyes and also having light fastness as in pigments. This structured dyestuff is utilized as a color filter for a liquid crystal display or an inkjet toner, while utilizing the characteristic that, after forming a soluble pigment precursor, this substance is subjected to an action of forming insoluble pigment grains of a nanometric size by chemical, thermal or photodecomposable means. However, according to these conventional technologies, the materials to be combined with pigments tend to be organic materials or polymers, so that investigations for practical use have been made only within this limited range, and no selective insolubilization means of dyestuff composites is available. For these reasons, they have not yet reached the stage where they are capable of practical use. This issue is one of the problems to be solved.

The aforementioned patent gazette is identified as follows.

Patent Document 1: Japanese Unexamined Patent Publication 1996-6242, and its counterpart U.S. Pat. Nos. 5,879,855 and 6,180,315.

SUMMARY OF THE INVENTION

Since the above-cited Patent Document 1 which is directed to conversion of soluble pigments to insolubilized pigments has become known, in spite of the recognition of its usefulness, the reasons why such technologies have not yet been put into practical use is based upon the following facts. That is, in addition to the fact that research has not been conducted in a wide application field, (1) the relationship between the soluble/insoluble conversion amount and the energy of the dyestuff is unclear, (2) a dissolution method and an addition method in inorganic or organic composite substrates have not yet been found, and (3) no thin films, or only thin films having a pattern, could be formed because the solvent is limited.

An object of the present invention is to provide a novel phenomenon for solving the problems of the foregoing conventional technologies, to create various kinds of functional films using the foregoing pigment based on this novel phenomenon and to provide display devices which employ such functional films.

For the sake of attaining the foregoing object, the technical concept of the present invention is based on the following findings.

(1) It has been found that by controlling the surrounding temperature during the step of converting a soluble pigment to an insoluble pigment by transferring energy and optimizing the wavelength and energy of radiations for conversion to the insoluble pigment, the grain size of the insoluble pigment can be controlled over a wide range, and in controlling the irradiation level of radiations, the proportion of conversion to the insoluble pigment can be freely controlled.

(2) It has been found that by enhancing the affinity of a metal alkoxide and an acrylic resin as materials having the deepest relationship with display devices, such as image display devices, using an acceptor base as a substrate of a dye that is alterable in the soluble/insoluble pigment thereof, the pigment can be uniformly coated on the surface of the acceptor base (for example, micro grains), or it can be taken into the pigment by microencapsulation.

(3) It has been found that by selecting a proper energy transferring method of converting plural dyestuffs to insoluble pigments (such as heating, irradiation with ultraviolet light, visible light or infrared light, ion implantation, and treatment with chemical species activating plasma), a single or plural materials are insolubilized, and the remaining solvent is washed away, whereby multiple colors can be patterned using one-stroke coating.

The gist of the present invention, based on the preceding findings, is exemplified by several kinds of display devices characterized as follows, respectively.

<Feature 1>

In a display device comprising an optical region, which consists of a plurality of first parts each formed of a plurality of dyestuff molecules which are aggregated thereat, and a second part including derivatives of the dyestuff molecule, the plurality of first parts are distributed in the second part separately, and the derivatives of the dyestuff molecule are soluble in one of the solvents in which the dyestuff molecule itself is insoluble.

<Feature 2>

In the display device comprising the feature 1, the solvent is a hydrophobic organic solvent.

<Feature 3>

In the display device comprising the feature 1, the one of the solvents is cured so as to be utilized for a binder material of the optical region, and the plurality of first parts are distributed in the one of the solvents being cured, while the derivative of the dyestuff molecules are dissolved therein in the second part.

<Feature 4>

In the display device comprising the feature 1, the derivatives of the dyestuff molecule are converted to the dyestuff molecules by transferring energy thereto.

<Feature 5>

In the display device comprising the feature 4, energy is transferred to the derivatives of the dyestuff molecule by at least one process selected from a group consisting of heat treatment applied to the derivatives, light irradiation thereto, electromagnetic waves irradiated thereto, plasma treatment thereof, and ion implantation applied thereto.

<Feature 6>

In the display device comprising the feature 5, a pattern of the plurality of first parts formed in the optical region is variable in accordance with the selection of the at least one process for transferring energy to the derivatives of the dyestuff molecule and the amount thereof.

<Feature 7>

In the display device comprising the feature 5, the optical region has a principal surface, and the evenness of the principal surface depends on the selection of the at least one process for transferring energy to the derivatives of the dyestuff molecule and the amount thereof.

<Feature 8>

In the display device comprising the feature 1, the derivatives dissolved in the second part of the optical region are classified into at least two kinds, which is obtained by chemical modification of at least two kinds of dyestuff molecules respectively, and the dyestuff molecules aggregated at the plurality of first parts of the optical region belong to one of the at least two kinds of dyestuff molecules.

<Feature 9>

In the display device comprising the feature 1, the dyestuff molecules aggregated at one group of the plurality of first parts of the optical region have a different molecular structure from those of the rest of the dyestuff molecules aggregated at another group of the plurality of first parts.

<Feature 10>

In the display device comprising the feature 1, each of the dyestuff molecules has at least one nitrogen atom therein, and the derivatives are obtained through chemical modification of the dyestuff molecules by combining a substituent to at least one nitrogen atom belonging thereto.

<Feature 11>

In the display device comprising the feature 1, the optical region is provided as a functional film having a principal plane for the display device.

<Feature 12>

In the display device comprising the feature 1, the plurality of first parts are distributed in the principal plane of the optical region, and the respective sizes of the plurality of first parts are varied gradually along a direction extended from one side of the principal plane to another side thereof that is opposite to the one side thereof.

<Feature 13>

In the display device comprising the feature 1, the optical region is an optical component assembled in the display device and has a principal surface that is transverse to an optical path that is extended from the display device.

<Feature 14>

In the display device comprising the feature 1, each of the plurality of first parts in the optical region is shaped into a nanofine particle each having a grain size not greater than 70 nm.

<Feature 15>

In a display device comprising an optical region containing a plurality of pigment grains, each formed by a plurality of pigment molecules encapsulated in an inorganic material, each of the plurality of pigment grains has a grain size not greater than 70 nm.

In this feature 15, the pigment grain may be compared to an organic-inorganic compound pigment.

<Feature 16>

In the display device comprising the feature 15, the plurality of pigment molecules are aggregated in each of the plurality of pigment grains.

<Feature 17>

In the display device comprising the feature 16, each of the plurality of pigment molecules is an organic compound having at least one nitrogen atom therein.

<Feature 18>

In the display device comprising the feature 17, each of the plurality of pigment molecules is modified chemically to be soluble in an organic hydrophobic solvent before encapsulation thereof in the inorganic material, and the chemically modified molecular structure thereof is converted into an original molecular structure thereof by energy transfer. The energy transfer to the chemically modified molecular structure in the feature 18 may be performed in a similar manner to the energy transfer to the derivatives of the dyestuff molecule in the feature 5.

<Feature 19>

In the display device comprising the feature 15, wherein the inorganic material is silica.

<Feature 20>

In a display device comprising a plurality of pixels, each having a light emitting layer formed of an organic material, the light emitting layer contains a plurality of pigment grains distributed in the organic material, and each of the plurality of pigment grains is formed of a plurality of dyestuff molecules aggregated or polymerized therein.

<Feature 21>

In the display device comprising the feature 20, each of the plurality of pigment grains has a grain size not greater than 70 nm.

In a display device comprising a optical region containing a plurality of pigment grains utilized for wavelength selection, anti-reflection, improvement for light emitting performance and the like, grain sizes of the pigment grains are suitably adjusted in the optical region in accordance with its use by introducing at least one of the aforementioned features to the display device.

Incidentally, the invention can be realized in the form of functional films, such as light antireflection films to be coated on the surface of a glass member (such as panel glass and screen glass) of a cathode ray tube or a FED having a glass member having a fluorescent layer formed in the interior thereof, wherein the fluorescent layer is caused to emit light by excitation of electron beams, and in the form of functional films to be provided in a polarizing plate, diffusing plate, or liquid guiding plate constituting a liquid crystal display. Also, the invention can be applied to a wavelength selective absorption micro lens to be formed on a luminescent layer, an electron transport layer, a hole injection layer, or an exit surface, each constituting a luminescent element of an OLED display device, an aspect of which heretofore has been considered impossible.

Incidentally, the invention is never limited to the foregoing functional films of display devices. Needless to say, the invention can be applied to various fields without departing from the technical concept thereof.

DETAILED DESCRIPTION OF THE INVENTION

Figure 1:
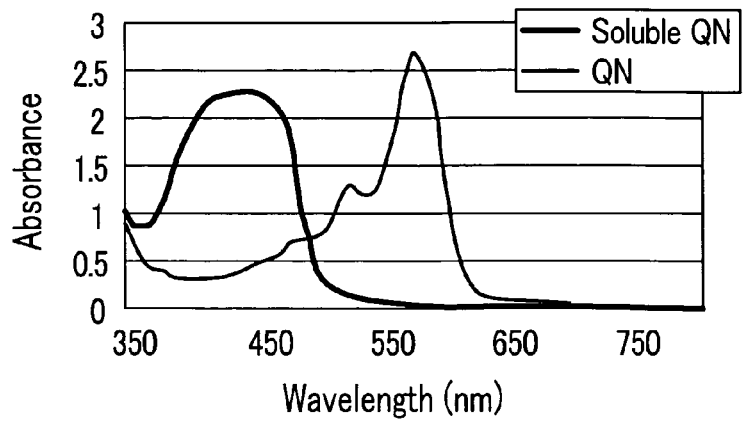
FIG. 1 is a graph of absorption spectra of a soluble quinacridon pigment and an insoluble quinacridon pigment.

A method of controlling the solubility of a pigment, according to the invention, in a solvent; a method of coating the surface of a member which will become a dyestuff acceptor while applying it; microencapsulation of nanofine grains comprising a dyestuff molecule; and a method of insolubilizing one of plural kinds of dyestuff molecules dispersed in a thin film against a solvent capable of dissolving the other dyestuff molecules therein, thereby subjecting the thin film to patterning of the one kind dyestuff molecule, will be described. Also, following these descriptions, various embodiments of the display device according to the invention will be specifically described.

[Conversion Method of Organic Pigment from Soluble Pigment to Insoluble Pigment]

Examples of pigments that are used in accordance with the invention include quinacridon, anthraquinone, perylene, perynone, threne, indigo, quinophtharone, isoindolinone, isoindoline, dioxane, diketopyrrolopyrrole (pyrrolizine), cyanine series, and azo series pigments. These pigments become soluble in organic solvents when a tert-butyl carbonate group represented by the following formula (1) or a substituent comprising its derivative is bound to the nitrogen atom of the molecule (pigment molecule).

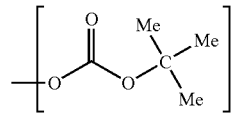
(1)

In the formula (1), Me represents a methyl group.

Also, any one of the substituents represented by the following formulae (2), (3) and (4), as disclosed in the above-cited Patent Document 1, may be bound to the nitrogen atom of any one of the foregoing pigment molecules in place of the tert-butyl carbonate group.

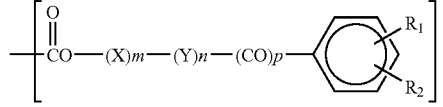
(2)

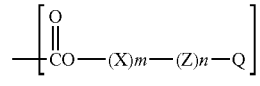
(3)

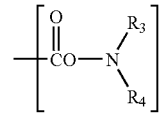
(4)

In the formulae (2), (3) and (4), m, n and p are each independently 0 or 1. The molecular structure X represents an alkylene group having from 1 to 4 carbon atoms or an alkylene group having from 2 to 8 carbon atoms. The molecular structure Y represents a molecular structure $-V-(CH_2)_q-$ containing a cycloalkylene group V having from 3 to 6 carbon atoms (wherein q represents an integer of from 1 to 6). The molecular structure Z represents a molecular structure $-V-(CH_2)_r-$ containing a cycloalkylene group V having from 3 to 6 carbon atoms (wherein r represents an integer of from 0 to 6). $R_1$ and $R_2$ each represents a hydrogen atom, an alkyl group, an alkoxy group, a halogen atom, a cyano group (—CN), a nitro group ($NO_2$), a phenyl group, or a phenoxy group. Q represents a hydrogen atom, a cyano group (—CN), a silane derivative ($Si(R_1)_3$), a derivative of a methyl group in which a part of the hydrogen atoms is replaced with a halogen atom, a sulfone group, a pyridine ring, or a naphthalene ring. $R_3$ and R₄ each represents a hydrogen atom, an alkyl group, or a substituent represented by the following formula (5).

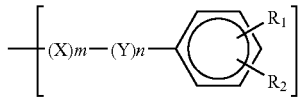
(5)

Substituents other than those described above may be introduced into the substituents described in the formulae (2), (3) and (4) according to the description of the Patent Document 1.

Even when the pigment is modified with any one of the substituents represented by the formulae (1), (2), (3) and (4), its solubility in organic solvents is markedly enhanced. Examples of solvents that are suitable for dissolving the modified pigment therein include chloroform, toluene, cyclohexane, and ketones (such as methyl ethyl ketone, cyclopentanone, and N-methyl-pyrrolidine).

In the Patent Document 1, which describes the substituents of the formulae (2), (3) and (4), the pigment having been modified therewith is used as its precursor. However, the present inventors have given consideration to the point that a pigment molecule and a modified pigment molecule, obtained by modifying the pigment molecule with the foregoing substituent, exhibit different characteristics (such as optical characteristics), and so, in some of the Embodiments of the display device according to the invention, modified pigment molecules that have hitherto been considered as a precursor are intentionally left in the display device.

Among the foregoing pigments, specific examples, in which by introducing a substituent upon actual synthesis, a pigment is made soluble in a solvent in which the pigment was originally insoluble, and energy is then transferred, thereby returning it to the original pigment, are represented by the pigments in Table 1.

precipitate was formed. This precipitate was filtered, washed with a solution of water/alcohol (1/1), and then dried to obtain a powder of quinacridon modified with a tert-butoxycarbonyl group. The dried powder was dissolved in chloroform and then purified by recrystallization.

The thus synthesized quinacridon pigment (modified quinacridon) has a solubility relative to chloroform, in which quinacridon before the modification is insoluble. This tert-butoxycarbonyl group-bound quinacridon was dissolved in a chloroform solution and spin coated on a glass substrate to form a film. When this film was heat treated at 150° C. for 30 minutes, the film color changed to yellowish orange. The wavelength profile of optical absorption of the modified quinacridon film formed on the glass substrate was measured before and after the heat treatment. FIG. 1 shows an absorption spectrum of the quinacridon pigment that is soluble in chloroform (modified quinacridon, hereinafter referred to as "soluble quinacridon pigment") and an absorption spectrum of the quinacridon pigment that is insoluble in chloroform (quinacridon after the heat treatment, hereinafter referred to as "insoluble quinacridon pigment"). In the drawing, the thick solid line (soluble QN) represents the absorption spectral characteristic of the soluble quinacridon pigment, and the thin solid line (QN) represents the absorption spectral characteristic of the insoluble quinacridon pigment.

As shown in FIG. 1, an absorption peak of the soluble quinacridon pigment appearing at the wavelength of 430 nm was shifted to an absorption peak wavelength of 578 nm of the insoluble quinacridon pigment by the heat treatment. The modified quinacridon after the heat treatment, exhibiting a maximum absorptivity against light having a wavelength of 578 nm, did not have solubility in chloroform. In view of the fact that the wavelength profile of optical absorption as seen in FIG. 1, which the modified quinacridon after the heat treatment (insoluble quinacridon pigment) has, and its insolubility in chloroform are identical with those of the quinacridon pigment before the modification (as a starting

TABLE 1

| Organic Pigment | | Substituent | Solvent | Transferred Energy |
|---|---|---|---|---|
| Quinacridon Red | Red | tert-Butoxycarbonyl group | Chloroform* | Heating: 150° C., 30 minutes |
| Acetoacetanilide series bisazo compound | Yellow | tert-Butoxycarbonyl group | Chloroform*, Cyclohexanone* | 1064 nm YAG-Laser Irradiation: 160 W |
| Diketopyrrolopyrrole | Red | tert-Butoxycarbonyl group | Cyclopentanone*, Polyhydroxystyrene* | Heating: 120° C., 60 seconds |
| Phthalocyanine Blue | Blue | Cyclohexyl group (C₆H₁₁—) | Cyclopentanone*, Polyhydroxystyrene* | Argon (Ar⁺) Laser Irradiation: 1 W, 60 seconds |
| Indigo Blue | Blue | tert-Butoxycarbonyl group | polystyrene*, Cyclopentanone* | CO₂ Laser Irradiation: 10 kW 10 μm |

*Disclosed in Japanese Unexamined Patent Publication 1996-6242

A method of introducing a substituent into the organic pigment will be described below with reference to a quinacridon pigment. Quinacridon (0.31 g) was mixed and stirred in 30 mL (milliliter, hereinafter the same) of dimethylformamide (DMF). To the solution, 0.05 g of 4-dimethylaminopyridine was added, and the mixture was additionally stirred. Further, 0.83 g of di-t-butyl dicarbonate was added to the resulting solution, and the mixture was stirred overnight. The solution changed to yellowish orange. When this solution was thrown into 200 mL of pure water, an orange ingredient in the foregoing experiment), it was estimated that the tert-butoxycarbonyl group capable of imparting solubility relative to chloroform is lost by the heat treatment, whereby the resulting quinacridon is returned to the state before the modification (generally known quinacridon pigment). On the other hand, identification by infrared light absorption spectrum of each of the quinacridon pigment and the insoluble quinacridon pigment obtained by heat treatment of the modified quinacridon revealed the same results. Accordingly, it was supported by the foregoing experiment that the insoluble quinacridon pigment obtained as a reddish purple product by heat treatment is the same as the quinacridon pigment of its starting ingredient. The insoluble quinacridon pigment was the same as the starting ingredient (quinacridon pigment before the modification) in not only insolubility in chloroform and optical absorption characteristics, but also as to other properties, such as heat resistance. It was confirmed from the foregoing experiment that, after synthesizing a substance from a pigment that is insoluble in a certain solvent, the substance being soluble in the subject solvent, the substance can be returned to the starting pigment that is insoluble in the subject solvent (so to speak, the pigment before modification, so as to make it soluble in the subject solvent) by transferring heat energy.

In the following description, a substance obtained by modifying a certain pigment (starting ingredient) having a solubility in a certain solvent in which the subject pigment is insoluble and a substance obtained by transferring energy to this soluble pigment and losing solubility in the subject solvent will be referred to as "soluble pigment" and "insoluble pigment", respectively. Even when a soluble pigment is returned to the same substance as the foregoing pigment of the starting ingredient upon energy transfer, for the sake of clarifying the matter that the subject substance has experienced a modification and energy transfer, the subject substance will be referred to as "insoluble pigment".

The present inventors have found that according to the kind and amount of energy to be transferred to the soluble pigment, the degree to which the subject soluble pigment is converted to the insoluble pigment can be controlled. The proportion (pigmentation ratio) when the modified quinacridon pigment (soluble pigment) is converted to quinacridon (insoluble pigment) upon acceptance of energy is shown for every kind of energy transfer in FIG. 2.

Figure 2:
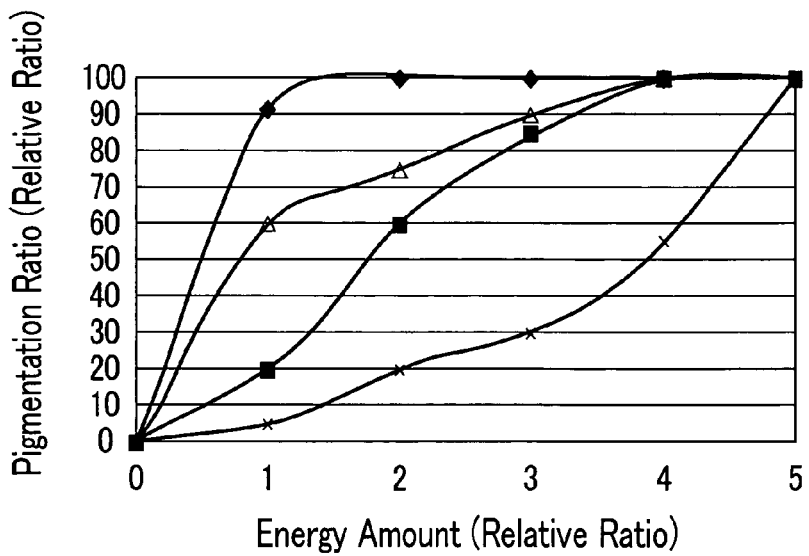
FIG. 2 is a graph of the relationship between the kind and amount of energy to be transferred to a thin film of a quinacridon pigment.

FIG. 2 shows the relationship between the amount of energy transferred to a thin film of the modified quinacridon pigment and the pigmentation ratio. The pigmentation ratio is defined to be 0% for a thin film of the modified quinacridon pigment before energy transfer and 100% for a thin film of the modified quinacridon pigment after energy transfer, and exhibiting a maximum optical absorptivity at the optical absorption peak wavelength of the quinacridon pigment before modification, respectively. With respect to the energy transferred to the modified quinacridon pigment, the maximum optical absorptivity of which is revealed between the optical absorption peak wavelength of the quinacridon pigment before modification and the optical absorption peak wavelength of the modified quinacridon pigment before energy transfer, a pigmentation ratio relatively calculated from a shift amount of the wavelength at which the maximum optical absorptivity appears relative to the respective optical absorption peak wavelengths is assigned.

The amount of energy to be transferred is defined according to different physical amounts, including the amount of ion implantation to a thin film of the modified quinacridon pigment, the time of irradiation of the thin film with light from a xenon lamp or oxygen ($O_2$) plasma, and the time of heating the thin film according to the a specific measure. However, in preparing the graph of FIG. 2, these physical amounts were replaced with the following relative amounts. First of all, the physical amount under the condition under which no energy is transferred to a thin film of the modified quinacridon pigment (soluble pigment) is defined as 0; a minimum value of the physical amount (i.e., ion implantation amount, irradiation time, and heating time) required for 100% pigmentation of the modified quinacridon pigment (full conversion to the insoluble pigment) is defined as 5; and this minimum value of this physical amount is divided into five equal parts, and relative values of 1, 2, 3 and 4 are assigned to the respective physical amounts.

The experiment involving the implanting of a platinum (Pt) ion in a thin film of the modified quinacridon pigment, the results of which are shown as curve A in FIG. 2, was carried out while setting up certain conditions, such as an accelerated voltage fall within the range where the molecular structure of the quinacridon pigment (the molecular structure of the original quinacridon other than the substituent for modification) is not broken. Also, the experiment involving the irradiating of a thin film of the modified quinacridon pigment with oxygen plasma, the results of which are shown as curve C, was carried out while setting up the irradiation conditions within the range where the molecular structure of the original quinacridon is not broken. In comparison with the results of irradiating a thin film of the modified quinacridon pigment with a xenon (Xe) lamp, as shown as curve B, and the results of heating the modified quinacridon pigment, as shown as curve D, the efficiency of pigmentation of the modified quinacridon pigment (conversion of the soluble quinacridon to the insoluble quinacridon) is high according to the ion implantation in the thin film of the modified quinacridon pigment and the plasma irradiation of the thin film of the modified quinacridon pigment. Also, it has become clear that the conversion efficiency to the insoluble quinacridon is markedly enhanced according to the ion implantation with energy corresponding to the characteristic absorption wavelength (peak wavelength of optical absorption) of the soluble quinacridon and the plasma irradiation. Moreover, it has become clear that the conversion ratio (pigmentation ratio) to the insoluble quinacridon is in proportion to the amount of accumulation of the transferred energy in any energy transfer.

Figure 3:
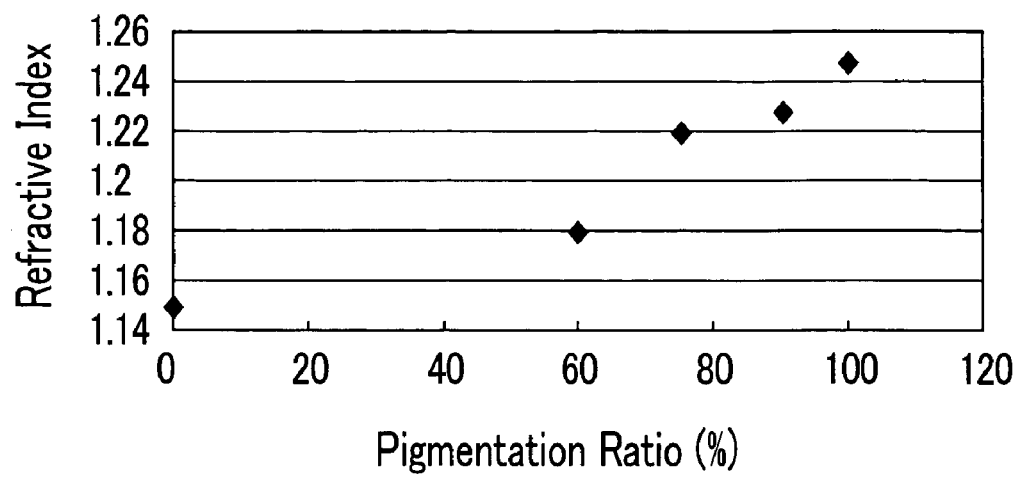
FIG. 3 is a graph of the variation of refractive index in proportion to pigmentation.

On the other hand, the present inventors have found that by transferring energy to a thin film of the modified quinacridon pigment (soluble quinacridon), the refractive index of the thin film varies with an increase of the pigmentation ratio (conversion ratio to the insoluble quinacridon). The results of examination of the relationship between the pigmentation ratio of a thin film of the modified quinacridon pigment that is irradiated with oxygen ($O_2$) plasma and the refractive index of the thin film are shown in FIG. 3. As shown in FIG. 3, the refractive index of the thin film formed of the modified quinacridon pigment varies in proportion to the pigmentation ratio, that is enhanced upon oxygen plasma irradiation (in that case, the refractive index increases). By utilizing this phenomenon, it becomes possible to freely design the refractive index of thin films or optical members containing a pigment not limited to quinacridon. Thus, for example, it becomes possible to prepare reflection free wavelength selective absorption films.

[Method of Control of Grain Size of Insoluble Pigment and Refractive Index by Optimizing Energy to be Transferred]

The present inventors have studied a step of modifying a quinacridon pigment with a substituent to form a soluble quinacridon pigment and transferring energy thereto to convert it to an insoluble quinacridon pigment at the molecular level. Not limited to quinacridon, a so-called "pigment" may be present as an aggregate or cluster formed when a plurality of dyestuff molecules containing a chromophore are aggregated. In the step of converting a pigment to a soluble pigment according to this invention, it is considered that a substituent bound to each dyestuff molecule constituting this pigment enhances the solubility or chemical affinity of the dyestuff molecule relative to a certain solvent, thereby retarding aggregation in the solvent. Accordingly, in the step of eliminating the substituent from the dyestuff molecule (soluble dyestuff molecule) that has become soluble in the solvent (so-called pigmentation step), the aggregation proceeds with an increase of the so-called insoluble dyestuff molecule from which the substituent has been lost.

As described previously with reference to FIG. 2, the pigmentation step of converting a soluble pigment to an insoluble pigment exhibits a tendency that is different according to the energy transfer morphology to the soluble pigment. On the assumption that the aggregation of dyestuff molecules in the pigmentation step can be controlled depending upon the conditions of transferring energy to the soluble pigment, the present inventors have sought to determine standards of controlling the grain size of the pigment (aggregate of the dyestuff molecules). As a result, two conditions for largely growing the grain size of the pigment have been found.

One of the conditions is (A) to coat a dyestuff-containing liquid (a solvent having a soluble pigment dissolved therein) on a substrate and activate the Brownian motion of dyestuff molecules (soluble dyestuff molecules) in the liquid (solvent); and the other is (B) to activate the surface of an aggregate of dyestuff molecules that have become insoluble in the solvent.

According to the condition (A), the probability of collision of the dyestuff molecules that have become insoluble in the solvent, the insolubilized dyestuff molecule with an aggregate thereof, and the aggregates is increased; and, according to the condition (B), the surface energy of the aggregate, when the insolubilized dyestuff molecule collides with its aggregate and the aggregates collide with each other, is lowered, thereby making agglomeration between the dyestuff molecule and its aggregate and agglomeration between the aggregates easy. Thus, the grain size of the aggregate of the dyestuff molecules, i.e., the pigment, is largely grown.

One of the reasons why the ion implantation or plasma irradiation to the soluble quinacridon pigment accelerates the pigmentation resides in the fact that the ion implantation or plasma irradiation readily meets the condition (B). The frequency (wavelength) of electromagnetic radiations (including light) of irradiating the soluble pigment, the electric power to be used in the treatment of the soluble pigment and the accelerated voltage of an ion to be ion implanted in the soluble pigment are likely to be reflected on the energy amount to be transferred to the soluble pigment thereby. This matter is easily understandable from a comparison with the fact that, in the case where the soluble pigment is heated to transfer energy thereto, since the heat is readily diffused, it is not always transferred to the soluble pigment. On the other hand, the soluble pigment comprises soluble dyestuff molecules obtained by binding a substituent to dyestuff molecules constituting the pigment as the starting ingredient; and, as described previously with reference to FIG. 1, the wavelength at which the soluble dyestuff molecules exhibit the maximum optical absorption is different from that of the dyestuff molecules before modification with the substituent. When the soluble dyestuff molecules are irradiated with electromagnetic radiations or plasma or ions implanted at higher energy than the energy corresponding to the peak wavelength (characteristic wavelength) of the optical absorption which the soluble dyestuff molecules exhibit, the foregoing condition (B) is met. In the case where the soluble pigment is irradiated with light, it is desired to make the wavelength of that light shorter than the characteristic wavelength of the soluble pigment.

In activating the surface of an aggregate of the dyestuff molecules by electromagnetic radiations (including light), taking into account the freezing point and boiling point of a solvent in which the aggregate is dispersed, by precisely controlling the temperature of the substrate accepting the pigment, it is possible to control the grain size of the pigment at a desired value. An example will be described below.

Figure 4:
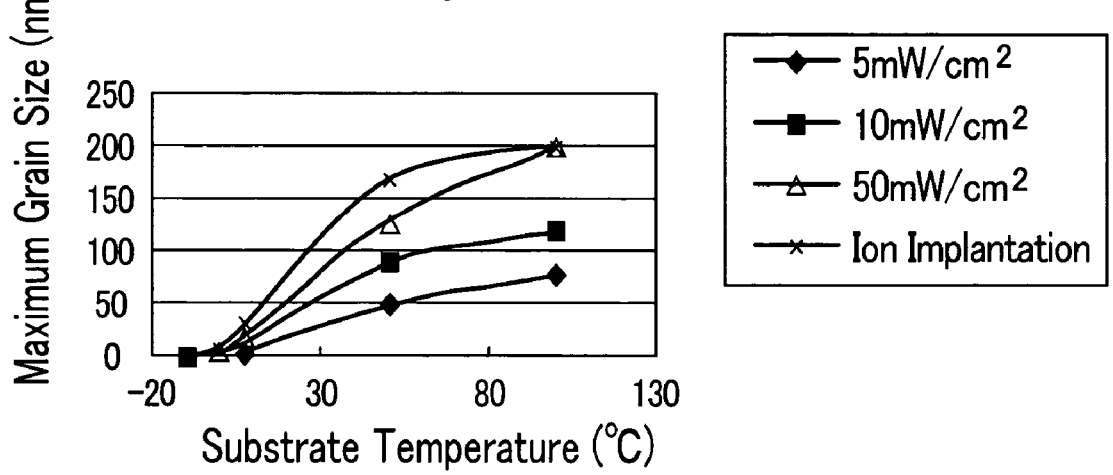
FIG. 4 is a graph of the relationship between substrate temperature and grain size.

A chloroform solution having a substituent-containing quinacridon molecule dissolved therein was spin coated on a glass substrate to prepare a thin film. At the same time of converting the temperature of the substrate from 20° C. to 40° C., light irradiation by a xenon (Xe) lamp was carried out for 60 seconds, each time by changing the output between 1 and 50 mW/cm$^2$. The resulting grain size (maximum grain size) is shown together with the results of implantation with an argon (Ar) ion in FIG. 4. In FIG. 4, the maximum grain size (nm) is the grain size of the largest grain within one field of view observed by high-magnification scanning electron microscope (SEM) photography. FIG. 4 shows the maximum grain size obtained when the light irradiation was carried out at an intensity of 5 mW/cm$^2$, 10 mW/cm$^2$, and 50 mW/cm$^2$, respectively.

[Method of Taking Nanofine Grains of Pigment into Microcapsule and Method of Coating it on the Surface of Dyestuff Acceptor]

Hitherto, it was impossible to utilize a pigment as nanofine grains because its grain size is large. The present inventors have found a technique in which dyestuff molecules constituting such a pigment are dissolved in a hydrophobic organic solvent by modification, and the resulting organic solvent is dispersed in a polar solvent, thereby taking the dyestuff molecules as a nanometer-size aggregate into a microcapsule. According to the method described below, it is possible to prepare a microcapsule of an arbitrary pigment covered by an inorganic oxide.

Quinacridon is solubilized in chloroform by the foregoing modification. The solubilized quinacridon (0.2%) is dissolved in chloroform, 20 mL of this chloroform solution is added in 100 mL of a polar solvent having the formulation shown in Table 2, and the mixture is stirred at from 800 rpm to 1,000 rpm for one minute while keeping the temperature of the polar solvent within the range of from 0° C. to 10° C. The resulting polar solvent is irradiated with an ultrasonic wave at an output of 1 kW and at a frequency of 28 kHz to finely disperse chloroform droplets in the polar solvent, and ammonia is added thereto with stirring, thereby adjusting the polar solvent at a pH of 9±0.5. The chloroform having no affinity with pure water becomes a fine microemulsion, and a silicon alkoxide monomer starts polymerization while the microemulsion functions as a nucleus. Thus, nanofine grains of the silicon alkoxide are formed containing the chloroform liquid therein, the grain size of which is from 30 nm to 40 mm.

Next, water is added to the polar solvent to separate it into two layers consisting of unreacted chloroform and an aqueous dispersion (polar solvent) containing the nanofine grains, and the aqueous dispersion is then separated from the chloroform. Ammonia is added to the separated aqueous dispersion until the pH becomes 10.5, thereby accelerating the polymerization of the silicon alkoxide on the surfaces of the nanofine grains dispersed therein. As a result, a droplet of the hydrophobic organic solvent comprising the solubilized pigment dissolved in a hydrophobic organic solvent (chloroform containing modified quinacridon) becomes a microcapsule in which the droplet is covered by stable silica grains in the polar solvent, and its size (grain size) can be made fine to a nanometer order (for example, not larger than 70 nm), the aspect of which was impossible in the conventional pigments. The microcapsule of the solubilized pigment covered by the silicon alkoxide polymer is dispersed as colored colloidal silica (hereinafter sometimes referred to as "CS") in the polar solvent.

With respect to the thus obtained pigment microcapsule (silica-organic pigment microcapsule), for example, by coating a colloid solution (the foregoing polar solvent) having the microcapsule dispersed therein on a part of a display device or its parts and then transferring energy to this coating film (the microcapsule is dispersed therein), a functional film having excellent optical characteristics is constituted within the display device, or the optical characteristics of the parts are enhanced, thereby ultimately markedly enhancing the performance of the display device per se. Two examples of the application thereof will be described below.

Incidentally, the microencapsulation of pigment described previously or specifically described below may be properly improved while referring to *Kagaku Kogaku Ronbunshu* (in Japanese), Vol. 27, No. 6, 11, 2001. pages 749 to 752.

TABLE 2

Compounds for Microencapsulation

| Compound | Concentration (weight %) |
| --- | --- |
| Silicon alkoxide monomer | 1 wt % |
| Polyethylene glycol | 2 wt % |
| Ethanol (ethyl alcohol) | 20 wt % |
| Pure (distillated) water | Residue |

(i) Application to wavelength selective absorption film (such as the micro lens on the exit surface of an OLED element):

To the colloid solution of colored CS, as prepared in the foregoing method, 0.5% of hydrolyzed ethoxysilane, 4.0% of ethanol, 1% of ethylene glycol, and water are added to prepare a 30% solution of this colored CS. This solution is uniformly coated on the outside (exit surface) of a glass in the light outcoupling side of an organic LED element (OLED element). After coating, the coating film is heated at 160° C. for 30 minutes to eliminate a substituent that is capable of making quinacridon (solubilized pigment) contained in the colored colloidal silica soluble in chloroform (hydrophobic solvent) therefrom, thereby returning the quinacridon to original quinacridon (conversion to the insolubilized pigment). There is thus formed a wavelength selective absorption film having light absorption characteristics of quinacridon (see QN in FIG. 1) on the exit surface of the OLED substrate.

As opposed to conventional technologies, in the wavelength selective absorption film of quinacridon formed on the exit surface of the OLED substrate of this example, the pigment dispersed in the film is very fine, such that the grain size is not larger than 70 nm and is aggregated (not dissolved in the solution). Accordingly, the resulting wavelength selective absorption film exhibits light absorption characteristics equal to that in conventional quinacridon (not modified). When the quinacridon pigment film formed on the exit surface of the OLED substrate in the conventional technique is designated as a lens array, that obtained by the technique of this example may be called a micro lens or a nanofine grain lens array. Hereinafter, the quinacridon pigment film formed on the exit surface of the OLED substrate obtained by the technique of this example will be designated as a "micro lens". However, it should not be construed that its shape and function are limited to lens arrays or analogs thereof.

The light outcoupling efficiency on the exit surface of the conventional OLED element is at most about 20% because an interface in which the refractive index varies in an optical path from a light-emitting region to an environment (the user side of the OLED element) through the exit surface is present (so to speak, the refractive index profile along the optical path). However, since multiple reflection at the interface can be inhibited by a thin film (micro lens) formed on the nanofine grains of the quinacridon pigment on the exit surface of the OLED element, the light outcoupling efficiency on the exit surface of the OLED element increases to about 80%. In the OLED element of this example, although about 20% of the light emitted from the light-emitting region is lost by multiple reflection, since more loss of the light is inhibited in the micro lens formed on the exit surface, its display luminance increases by at least about 4 times that of the conventional ones. When the OLED element provided with a micro lens having the wavelength selective absorption properties of the quinacridon pigment was compared with an OLED element provided in a colorless micro lens having the same shape, for example, the red chromaticity value of the chromaticity coordinates changed from (0.60, 0.40) to (0.63, 0.35), and an improvement in color purity corresponding thereto was confirmed.

(ii) Addition to fluorescent slurry of CRT, PRT, PDP or FED:

The colored CS as prepared in the foregoing method is added to the fluorescent slurry provided in a CRT, PRT, PDP or FED. The colored CS is dispersed as a filler in a polar solvent as a binder of the slurry together with a fluorescent substance. The colored CS is formed for every pixel of red (R), green (G) or blue (B) by, for example, modifying the organic pigment listed in Table 1 with a substituent corresponding thereto, dissolving the resulting organic pigment in a corresponding solvent, and then following the foregoing procedure. The red fluorescent slurry, green fluorescent slurry and blue fluorescent slurry, each containing the colored CS, are coated for every pixel, to which is then applied heat or irradiated light to form a display screen. In the thus formed display screen, a wavelength selection effect was emphasized in each of the RGB pixels, whereby the display contrast was enhanced.

Next, microencapsulation other than by the foregoing method of forming the colored CS using a silicon alkoxide will be described. A chloroform liquid containing a red pigment of quinacridon (modified quinacridon) having a tert-butoxycarbonyl group (hereinafter sometimes referred to as "t-BOC group") bound thereto is added to a methyl ethyl ketone liquid containing 0.1% of a mercapto series silane coupling agent (such as "X-12-414", a trade name of Shin-Etsu Silicone), and the foregoing modified quinacridon (starting ingredient of the red pigment) is added to a solution of this methyl ethyl ketone liquid and chloroform in a mixing ratio of chloroform to methyl ethyl ketone (MEK) of 20/80 such that the concentration of the modified quinacridon becomes 0.2% in the mixed solution, followed by stirring. At that time, though a composite of the modified quinacridon molecule and the silane coupling agent is formed in the liquid, the composite reacted with tert-butyl phosphate, thereby completing surface coating of the quinacridon molecule by the silane coupling agent. With respect to the coating method of the organic material with the silane coupling agent, reference can be made to *Abstract of the*

Chemical Society of Japan, 78th Spring Meeting in Kobe, March (2001). According to this method, a silica-organic pigment microcapsule is formed in which the surrounding of an aggregate (agglomerate) of the pigment molecules having a grain size in the order of from several nm to several tens nm is covered by an extremely thin silica layer. Incidentally, the technique of controlling the optical characteristics of nanofine grains of the organic pigment by energy transfer to the silica-organic pigment microcapsule is not particularly limited, but, for example, the foregoing heat treatment or light irradiation may be employed.

In the case where the microcapsule formed by any technique is adhered onto the surface of a dyestuff acceptor by coating a solution of the microcapsule dispersed therein, etc., the surface of the dyestuff acceptor is covered by a fine pigment block (nanofine grains of the pigment) having a grain size of not larger than 70 nm. Also, by crystallizing the dyestuff molecules by the pigment block, it is possible to cover the surface of the dyestuff acceptor by a pigment free from bias of orientation.

[Method of Patterning a Thin Film Containing Plural Kinds of Dyestuffs Having a Different Color Developing Wavelength Region for Every Color]

In a series of studies according to the invention, the present inventors have found a technique in which, by transferring energy to a thin film containing plural kinds of dyestuffs having a different color developing wavelength region or absorption wavelength region from each other, a dyestuff molecule is selectively aggregated in one kind of the dyestuffs, thereby forming a pattern of a pigmentation region (insolubilization region) of the dyestuff molecule in the thin film. According to this technique, a dyestuff molecule to be used for the formation of the pigmentation pattern accepts energy inherent to elimination of a substituent of solubilizing it, and only the subject dyestuff molecule is selectively converted to an insoluble pigment. In another words, the desired monochromic pattern is formed on the thin film depending upon the energy to be transferred to the thin film capable of presenting plural colors. An example of forming red and blue two-color dot patterns on a thin film containing a derivative (molecule modified with a substituent) of each of a dyestuff molecule having a red chromophore and a dyestuff molecule having a blue chromophore will be described below.

A tetrahydrofuran solution having dissolved therein a t-BOC group-containing diketopyrrolopyrrole (modified red dyestuff molecule) and cyclohexyl group-containing Phthalocyanine Blue (modified blue dyestuff molecule), as set forth in Table 1, was added to an acrylic resin, and the mixture was spin coated on a glass substrate to form a thin film. The absorption peak of the modified diketopyrrolopyrrole solution appeared at a wavelength of 450 nm, and the absorption peak of the modified Phthalocyanine Blue solution appeared at a wavelength of 600 nm. Also, the modified diketopyrrolopyrrole solution did not substantially absorb light having a wavelength of 600 nm, and the modified Phthalocyanine Blue solution did not substantially absorb light having a wavelength of 450 mm.

Then, a position of the acrylic resin thin film on which a red dot was to be formed and a position thereof on which a blue dot was to be formed were irradiated with light having a wavelength of 450 nm and light having a wavelength of 600 nm, respectively, for 5 minutes, and the resulting acrylic resin thin film was dipped in a THF (tetrahydrofuran) solution for 10 seconds to wash away the unconverted dyestuffs. The "unconverted dyestuffs" as referred to herein refers to the modified phthalocyanine that was not reactive with light having a wavelength of 450 nm at the red dot position (blue dyestuff molecule soluble in tetrahydrofuran) and modified diketopyrrolopyrrole that was not reactive with light having a wavelength of 600 nm at the blue dot position (red dyestuff molecule soluble in tetrahydrofuran). By dipping the acrylic resin thin film having been irradiated with light having a wavelength of 450 nm and light having a wavelength of 600 nm in tetrahydrofuran, dot patterns of the two colors of red and blue were formed on the thin film. While taking the time of irradiating the acrylic resin thin film with light of a varied wavelength (at either position of the red dot position or the blue dot position) as an axis and the absorbance that the red dot position or the blue dot position exhibits against the light having a corresponding wavelength as another axis, the relation between the light irradiation time to the respective dot position (energy transfer condition) and the absorbance that the respective dot position exhibits at a prescribed wavelength is shown in FIG. 5.

Figure 5:
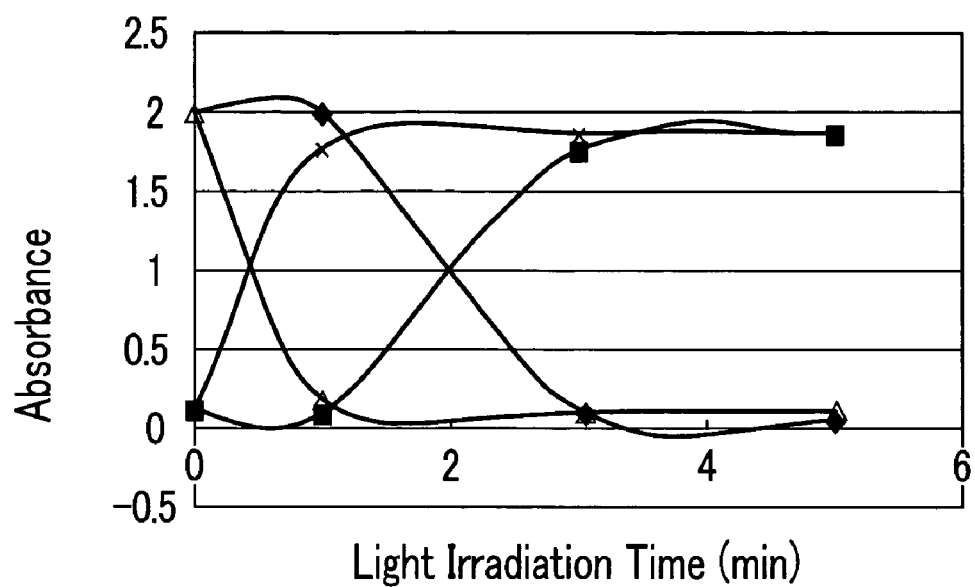
FIG. 5 is a graph showing the variation at each of the 450 nm peak for red dot, the 570 nm peak for red dot, the 600 nm peak for blue dot and the 630 nm peak for blue dot.

In FIG. 5, the curve designated with "450 nm peak for red dot" reflects the residual amount of modified diketopyrrolopyrrole in the acrylic resin thin film, and the curve designated with "570 nm peak for red dot" reflects the proportion at which the t-BOC group is eliminated from the modified diketopyrrolopyrrole. The modified diketopyrrolopyrrole molecule loses solubility in the tetrahydrofuran solution upon elimination of the t-BOC group therefrom and aggregates into the pigment having a prescribed grain size, whereby it is visually confirmed as the red dot. Accordingly, when the red dot position is visually confirmed as a clear red color, light having a wavelength band (for example, 570 nm) of a yellowish green color (near green color) as a complementary color to the red color is established.

On the other hand, in FIG. 5, the curve designated with "600 nm peak for blue dot" reflects the residual of the modified phthalocyanine in the acrylic resin thin film, and the curve designated with "630 nm peak for blue dot" reflects the proportion at which the cyclohexyl group is eliminated from the modified phthalocyanine. The modified phthalocyanine molecule loses solubility in the tetrahydrofuran solution upon elimination of the cyclohexyl group therefrom and aggregates into the pigment having a prescribed grain size, whereby it is visually confirmed as the blue dot. Accordingly, when the blue dot position is visually confirmed as a clear blue color, light having a wavelength band (for example, 630 nm) of an orange color (near red color) as a complementary color to the blue color is established.

When the acrylic resin thin film containing the modified diketopyrrolopyrrole (so to speak, a variant of the red dyestuff molecule) and the modified phthalocyanine (so to speak, a variant of the blue dyestuff molecule) was irradiated with light of a wavelength region other than the so-called characteristic absorption wavelengths at which the absorbance of the thin film (binder) changed (blue: 450 nm, green: 570 nm, red: 600 nm and 630 nm), insolubilization of pigments corresponding to the respective dyestuff variants did not occur, the aspect of which is not shown in FIG. 5, however. As is clear from FIG. 5, by irradiating the thin film having dyestuff variants (substituent-modified dyestuff molecules) dissolved therein with light having characteristic absorption wavelengths corresponding to these dyestuff variants, absorption by the dyestuff variants disappears with a lapse of the irradiation time, whereby absorption of pigments formed upon elimination of the substituents from the dyestuff variants becomes strong. This demonstrates that plural kinds of the dyestuff variants mixed in the thin film (also referred to as "solvent" or "binder") are individually pigmented depending upon the time of irradiating the thin film with light having a specific absorption wavelength, thereby possibly bringing about insolubilization relative to a prescribed solvent. Accordingly, according to such a principle, when a resin having dyestuff variants of three colors (red, green and blue) mixed therein is coated on a glass substrate and locally irradiated with individual light, patterns having a different color as in color filter substrates can be formed.

As described, in the conversion method of an organic pigment from a soluble pigment to an insoluble pigment according to the invention, when energy is transferred to substituent-modified dyestuff molecules to eliminate the substituent, and the dyestuff molecules from which the substituent has left (those having an original molecular structure) are aggregated, the size of the resulting aggregate relies upon the method of energy transfer to the modified dyestuff molecules and the transfer amount. Accordingly, when an acrylic resin member having the modified diketopyrrolopyrrole and the modified phthalocyanine dissolved therein is irradiated with light having a wavelength at which the light is easily absorptive in the modified diketopyrrolopyrrole, while its intensity is changed corresponding to the site of the acrylic resin member, plural red dots having a different size from each other can be formed on the acrylic resin member. Similarly, when the acrylic resin member is irradiated with light having a wavelength at which the light is easily absorptive in the modified phthalocyanine while its intensity is changed, plural blue dots having a different size from each other can be formed on the acrylic resin member.

When an acrylic resin member is partially irradiated with light having a wavelength at which the light is easily absorptive in the modified diketopyrrolopyrrole, the modified diketopyrrolopyrrole present in the irradiated portion loses the substituent (t-BOC group) to form an aggregate of diketopyrrolopyrrole (not modified). On the other hand, in other portions of the acrylic resin member not irradiated with the light having such a wavelength, the modified diketopyrrolopyrrole does not lose the substituent, but keeps the dissolved state in the acrylic resin. Also, to the extent that the light having such a wavelength is not absorbed in the modified phthalocyanine, the modified phthalocyanine does not lose the substituent (cyclohexyl group) over the whole of the acrylic resin, but keeps the dissolved state in the acrylic resin. Accordingly, in the structure of the thus light-irradiated (energy-transferred) acrylic resin, a portion where the dyestuff molecule (diketopyrrolopyrrole) is aggregated and a portion where a so-called dyestuff molecule derivative (modified diketopyrrolopyrrole) formed upon modification of the foregoing dyestuff molecule with the substituent is dissolved are present. In other words, the acrylic resin member (working as a functional film of display device or an optical member as described later) is comprised of a first region where the dyestuff molecule is aggregated and a second region where the dyestuff molecule derivative is dissolved.

A phenomenon in which there is a region (first region) where the dyestuff molecule is aggregated in a solvent and a binder as a solidified material of the solvent (acrylic resin member) and a region (second region) where the dyestuff molecule derivative is dissolved also occurs when the dyestuff molecule is replaced by the foregoing phthalocyanine or others. Also, this phenomenon occurs when only one kind of dyestuff molecule is contained in the solvent (binder). Further, even when a solvent of a solution containing the dyestuff molecule derivative as a solute is coated on a dyestuff acceptor and then completely removed from the surface of the dyestuff acceptor upon drying before and after energy transfer, the first region and the second region are formed on the surface of the dyestuff acceptor. In contrast to the foregoing technique of taking nanofine grains of a pigment into a microcapsule, an aggregate of the dyestuff molecule to be formed in the first region can be grown more largely than the nanofine grains by the energy to be transferred to a derivative thereof.

The method of converting an organic pigment from a soluble pigment to an insoluble pigment, the method of taking nanofine grains of the pigment into a microcapsule and the method of coating the microcapsule on the surface a dyestuff acceptor, and the method of patterning a thin film containing plural kinds of dyestuffs having a different color developing wavelength every dyestuff according to the invention have been described previously. Embodiments of the invention to which these techniques are applied will be described below.

EMBODIMENT 1

Example of Application to Screen of a Standard Cathode Ray Tube:

A quinacridon pigment (0.3 g) having a t-BOC group bound to the nitrogen atom thereof, as described in Table 1, and a dis-azo yellow pigment not modified with a substituent were dissolved in chloroform, to which there was then added a chloroform/n-butanol 50% solution of a siloxane-modified acrylic resin (hereinafter referred to as "solution of the invention"). The chloroform/n-butanol 50% solution is a mixed solvent of chloroform and contains 50% of 50% n-butanol. For comparison with the solution of the invention, the same amounts of a quinacridon pigment not modified with a substituent (t-BOC group) and a dis-azo yellow pigment not modified with a substituent were added to the chloroform/n-butanol 50% solution. As a result, coprecipitation occurred in the resulting comparative solution. This is because a zeta ($\zeta$)-potential of the non-modified quinacridon pigment has a charge opposite to the non-modified dis-azo yellow pigment, and, therefore, affinity works between the these pigments (dyestuff molecules) to cause aggregation.

The solution of the invention was coated on a glass substrate to form a pigment film, which was then treated at 100° C. for 5 minutes and at 170° C. for an additional one minute. The heat treated pigment film has an absorption peak at 585 nm and broad absorption at 40 nm or shorter. This pigment film is effective for absorbing excessive external light that has been reflected onto the fluorescent surface of the CRT or PDP serving as the image receiving tube or display and is an external light reflection reducing film capable of realizing an enhancement in color purity and a high contrast at the same time.

According to a similar technique, a similar film could be formed on a polyethylene terephthalate (PET) film. Also, by providing the foregoing external light reflection reducing film on the screen of a PDP, not only external light, but also light emission of neon (Ne) gas sealed in a pixel cell in the vicinity at 580 nm are absorbed. Since the light of this wavelength is radiated as yellow light from the screen, it becomes a noise causing a fade in image quality in the action of the PDP to display images of the three primary colors (RGB) of red, green and blue. For that reason, by providing a film, such as the foregoing external light reflection reducing film, as a film sticking layer on the screen, it is possible to shield light other than those of desired wavelength bands to be radiated from the respective pixel cells of RGB colors, and the contrast of the display image of the PDP visually confirmed by users is enhanced. Such effects can be utilized in a CRT or FED for a counter measure against the problem that the fluorescent substance provided therein emits not only light of the desired wavelength bands, but also yellow light upon irradiation with electron beams.

EMBODIMENT 2

Figure 6A:
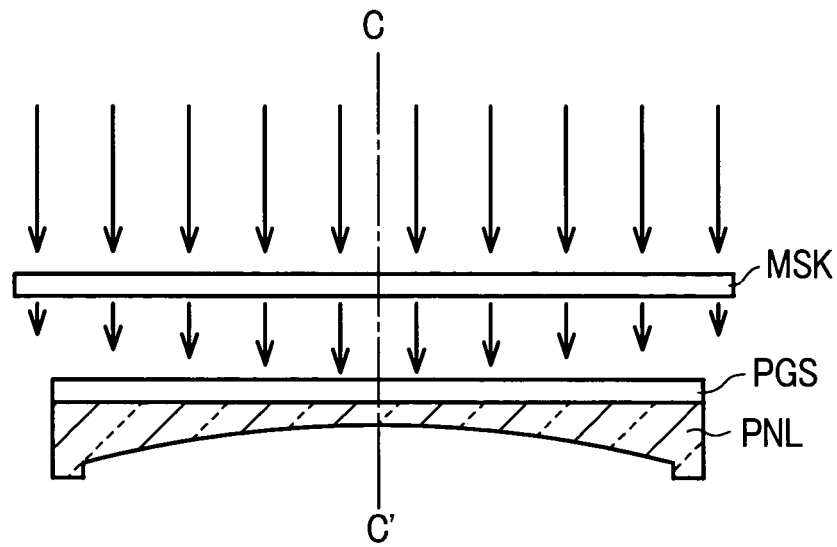
FIGS. 6A to 6C are diagrams showing a method of forming a transmittance-controlled film in Embodiment 2 of the invention.
Figure 6B:
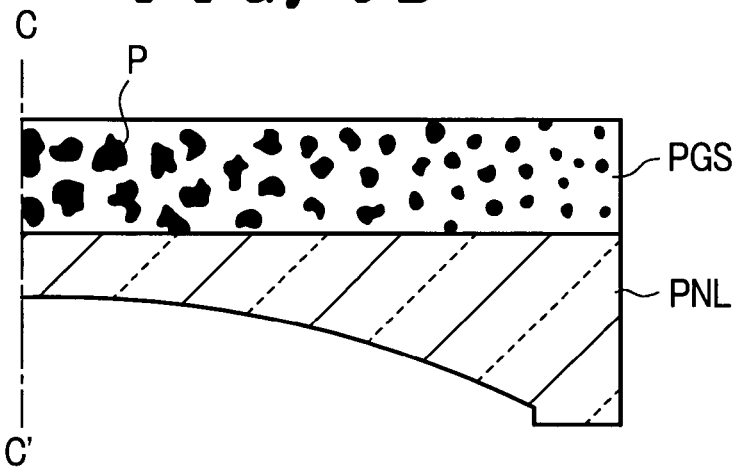
Figure 6C:
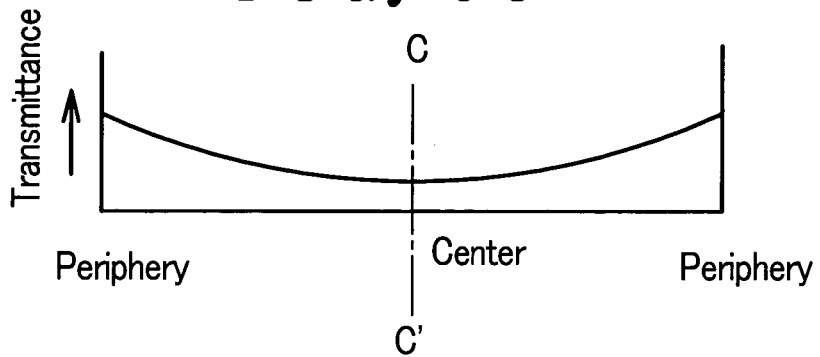

Example of Application to Screen of a Flat Panel Cathode Ray Tube:

FIGS. 6A to 6C are diagrams showing an example of a method of forming a transmittance-controlled film representing an Embodiment 2 of the invention. In FIG. 6A, the chloroform/n-butanol solution of a t-BOC group-containing quinacridon pigment and a dis-azo yellow pigment, as described in connection with Embodiment 1, is coated on the surface of a flat panel PNL of a cathode ray tube and dried to prepare a coating film PGS. The transmittance of this panel of the cathode ray tube is 85% in the center and 77% in the periphery, and coating of the solution is conducted by spin coating. The coating film PGS is irradiated with an argon (Ar) laser through a chromium film-deposited quartz mask MSK. That is, exposure is conducted for 60 seconds through the chromium film-deposited quartz mask MSK, the density of which is continuously changed such that the optical intensity in the center of the panel PNL is 10 mJ, whereas the optical density in the periphery thereof is 3 mL, respectively. The intensity of the laser light which passes through the chromium film-deposited quartz mask MSK is designated by the size of the arrows.

Figure 7:
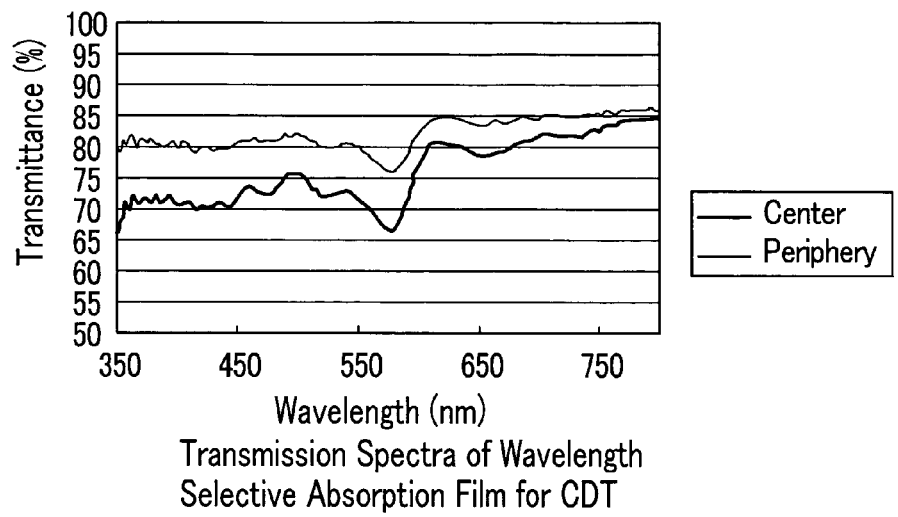
FIG. 7 is a graph of the transmission spectra in the center and periphery of a transmittance-controlled film in Embodiment 2 of the invention.

A soluble pigment becomes an insolubilized pigment P depending upon the intensity of the laser. FIG. 6B shows an enlarged view of half of the panel. As shown in FIG. 6B, the grain size of the insolubilized pigment P is large in the center of the panel PNL (the left side of FIG. 6) and becomes gradually smaller towards the periphery of the panel PNL (right side of FIG. 6). Thereafter, the residual soluble pigment in the coating film PGS was washed away using tetrahydrofuran and then dried at 100° C. for 20 seconds. Thus, a transmittance-controlled film having a gradation characteristic such that the transmittance in the center is 73%, whereas the transmittance in the periphery is 81%, as shown in FIG. 6C, could be prepared. The transmission spectra in the center and the periphery of the transmittance-controlled film having such a transmittance gradation are shown in FIG. 7. As a result, the transmittance in the panel surface of the flat panel cathode ray tube became uniform, and the uniformity of luminance in the center and the periphery was improved.

EMBODIMENT 3

Example of Application to an Organic EL (OLED) Display Device:

The tert-BOC group-modified diketopyrrolopyrrole (soluble diketopyrrolopyrrole) and cyclohexyl group-modified Phthalocyanine Blue (soluble phthalocyanine), as indicated in Table 1, were dissolved in a chloroform solution containing methyl methacrylate, and the solution was spin coated on a glass substrate of an OLED display device. Thereafter, a red dot position was selectively subjected to $O_2$ plasma treatment using a shadow mask to convert the soluble diketopyrrolopyrrole to diketopyrrolopyrrole insoluble in tetramethylammonium hydroxide, and a blue dot position was selectively irradiated with a YAG laser to convert the soluble phthalocyanine to phthalocyanine insoluble in tetramethylammonium hydroxide. Subsequently, the soluble pigments of diketopyrrolopyrrole and phthalocyanine remaining in the thin film were washed away using a 2.5% tetramethylammonium hydroxide solution.

According to the conventional OLED display devices, with respect to the chromaticity of the blue (B) pixel, since luminous components at 500 nm or more are large, the degree of saturation of the blue color itself was poor. Also, with respect to the red (R) pixel, since organic materials releasing red light are orange, and luminous components at 600 nm or less are large, the degree of saturation of red color itself could not be increased. However, according to the invention, the solvent having dissolved therein the modified diketopyrrolopyrrole and the modified phthalocyanine is coated on the exit surface (major surface of the substrate) of the OLED display element, to which energy is then transferred, thereby forming a red filter of diketopyrrolopyrrole in a red pixel and a blue filter of Phthalocyanine Blue in a blue pixel. The red filter of diketopyrrolopyrrole may be replaced by a red filter of Quinacridon Red. The red filter formed in the red pixel absorbs light emission of the light released from the luminescent layer in the shorter wavelength side than the red wavelength band. The blue filter formed in the blue pixel absorbs light emission of the light released from the luminescent layer in the longer wavelength side than the blue wavelength band. Thus, by removing excessive light emission generated from each of the red pixel and the blue pixel, the blue (B) and red (R) chromaticities of the OLED display device were greatly improved.

The results of improvement in the chromaticity by use of the filters of the invention are shown in Table 3.

TABLE 3

Chromaticity changes in chromaticity coordinates before/after using red filter and blue filter

| (x, y) Chromaticity | Before using filter (without R/B filter) | After using filter (with R/B filter) |
|---|---|---|
| R (Red filter) | (0.59, 0.40) | (0.62, 0.34) |
| B (Blue filter) | (0.16, 0.18) | (0.165, 0.08) |

EMBODIMENT 4

Figure 8A:
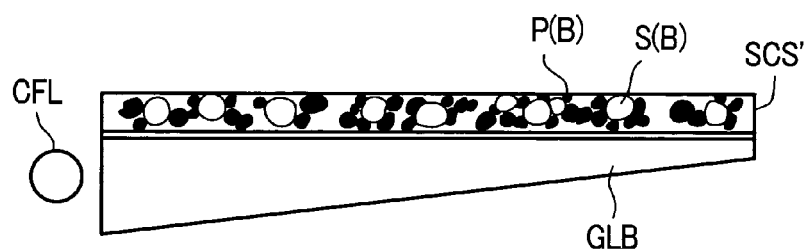
FIGS. 8A and 8B are diagrammatic sectional views which schematically show the major section of a diffusing plate of a back light of a liquid crystal display device according to the invention in comparison with a conventional diffusing plate.
Figure 8B:
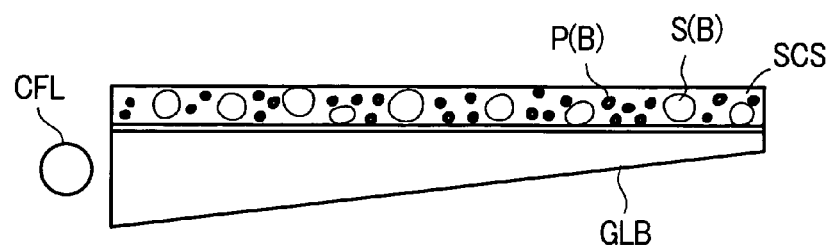

Example of Application to Diffusing Plate of a Liquid Crystal Display:

FIGS. 8A and 8B are diagrams which schematically show the major section of a back light of a liquid crystal display having a diffusing plate according to the invention, in comparison with a conventional diffusing plate. FIG. 8A shows the conventional diffusing plate, and FIG. 8B shows the diffusing plate of the invention. In a liquid crystal display device using a so-called side light type back light, the light from a fluorescent tube (generally, cold cathode fluorescent lamp) CFL is converted to a surface light source by a light guiding plate GLB, and it illuminates a liquid crystal display panel (not shown) through an optical member, such as a diffusing plate SCS, and the light modulated by the liquid crystal display panel is emitted from the display surface side. On the diffusing plate SCS, an optical member, such as a prism sheet, is laminated. According to the combination of such optical members, there is a problem in that the tint of an image displayed on the liquid crystal display panel becomes yellowish. For the sake of solving this problem, it is proposed to use a beads-coated film laminate for light diffusion using silica beads S(B) colored with Phthalocyanine Blue P(B) as a diffusing sheet SCS' as shown in FIG. 8A (see Japanese Unexamined Patent Publication 2002-127341). However, in this diffusing plate SCS', since the grain size of the Phthalocyanine Blue serving as the blue pigment is large, the coloration to the beads is non-uniform, and the color purity of the diffusing plate SCS' is lowered.

Then, 0.3 g of the substituent-modified Phthalocyanine Blue as a soluble pigment, as described in Table 1, is added to 100 g of an acrylic resin together with silica beads S(B) having a mean grain size of 5 µm. The soluble pigment (modified Phthalocyanine Blue) is dissolved in the acrylic resin to form a binder, and the silica beads S(B) are dispersed as a filler in this binder. The resulting binder (acrylic resin having the soluble pigment dissolved therein) is, for example, coated on the light guiding plate GLB to form a thin film. This thin film is irradiated using a carbon dioxide gas laser having an oscillation wavelength of 10 µm for 60 seconds to eliminate the substituent of the soluble pigment that is dissolved in the binder, thereby returning the soluble pigment to original Phthalocyanine Blue. The Phthalocyanine Blue from which the substituent has been eliminated causes aggregation at any place in the thin film, thereby uniformly forming plural fine pigment grains P(B) in the thin film (substrate of the diffusing plate SCS), as shown in FIG. 8B. Also, the silica beads S(B) are dispersed in the thin film regardless of the deposition of the pigment grains P(B) of Phthalocyanine Blue. When the insolubilized pigment (Phthalocyanine Blue from which the substituent has been eliminated) is thus uniformly dispersed in the thin film, a diffusing plate SCS having excellent light fastness and a uniform blue tint is obtained. FIG. 8B shows the cross-sectional structure of a back light using the diffusing sheet (sheet-form diffusing plate SCS) of this Embodiment. By using this diffusing sheet, the white tint of the back light was greatly improved. Table 4 shows the results of measurement of the reflectance of the diffusing plate SCS of this Embodiment along with that of the conventional diffusing plate SCS'.

TABLE 4

Reflectance (Reflectivity) of Diffusing Plate

|  | Haze | Reflectance (reflectivity) of diffusing plate: (a*, b*) |
|---|---|---|
| Invention | 92% | (+1.55, −5.99) |
| Conventional Example | 92% | (+1.05, +10.58) |

Incidentally, the reflectance of the diffusing plate is expressed in terms of (a*, b*) chromaticity.

EMBODIMENT 5

Example of Application to Light Guiding Plate of a Liquid Crystal Display:

As means for solving the same problem as considered in Embodiment 4, it is also effective to add a coloring agent that does not generate light scattering in the liquid guiding plate. Also, it is possible to add pigments capable of cutting excessive lights other than the three R, G and B wavelengths. By controlling the grain size of the pigment added in the light guiding plate, it also become possible to design a degree of scattering in the light guiding plate.

Figure 9A:
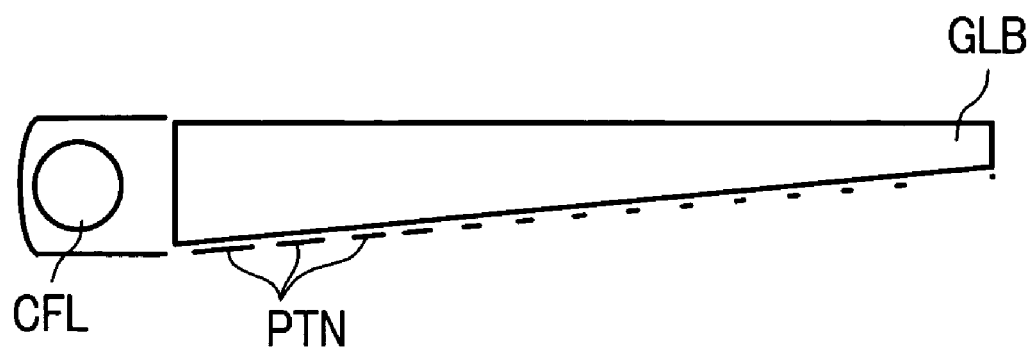
FIGS. 9A and 9B are diagrams schematically showing the major section of back light of a liquid crystal display device.
Figure 9B:
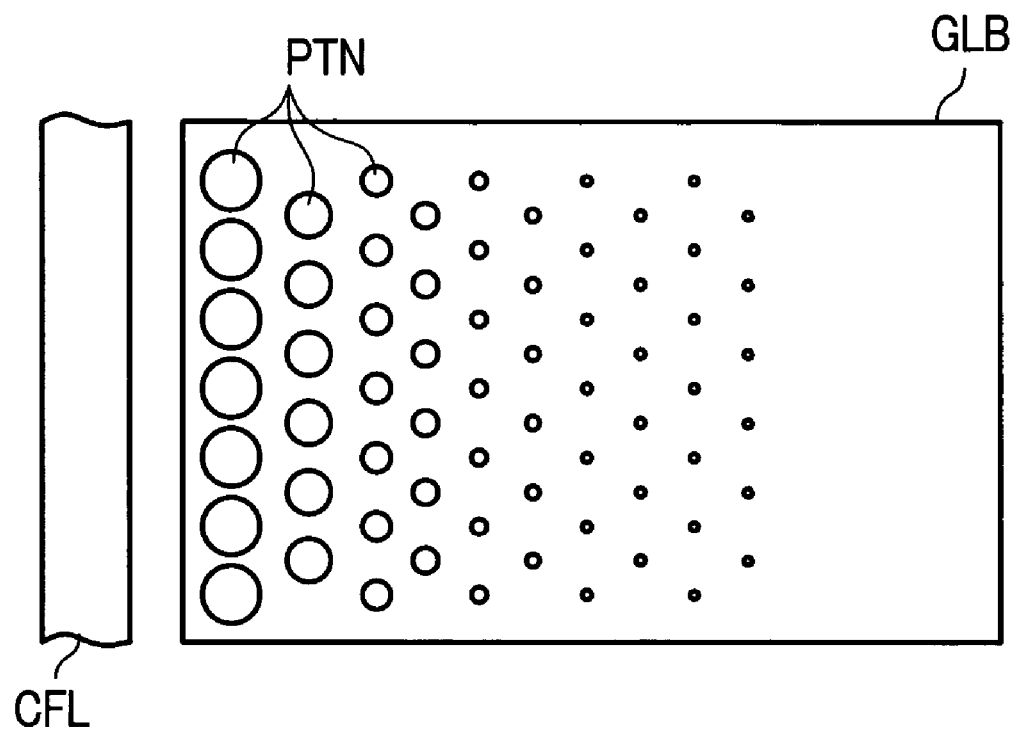

FIGS. 9A and 9B schematically illustrate the major section of a back light of a liquid crystal display, in which FIG. 9A shows the cross section, and FIG. 9B shows the plane on the opposite side (back face) to the liquid crystal display panel. In the back face of the light guiding plate GLB, a reflection pattern PTN is formed for reflecting light that comes from a cold cathode fluorescent lamp CFL and the light out in the liquid crystal display panel direction. According to conventional technologies, the reflection pattern PTN is formed by printing white dots or producing fine irregularities. As an example, according this Embodiment, the reflection pattern PTN is formed in the following manner.

Figure 10A:
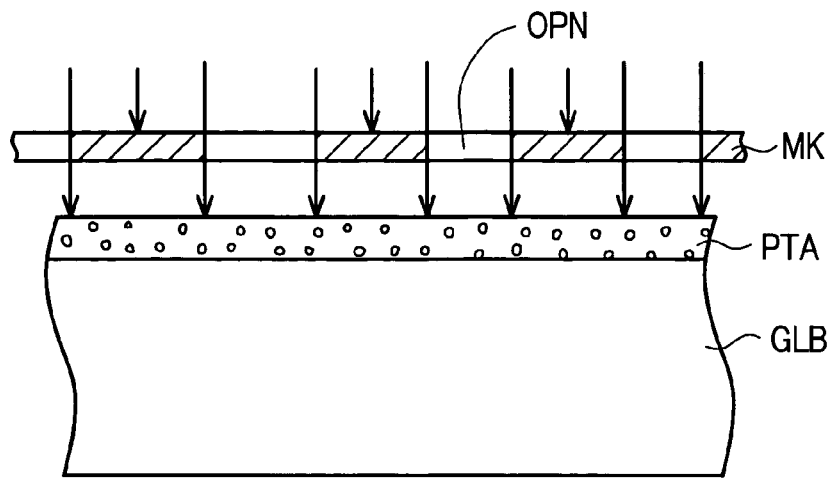
FIGS. 10A and 10B are diagram showing a method of forming the reflection pattern shown in FIG. 9.
Figure 10B:
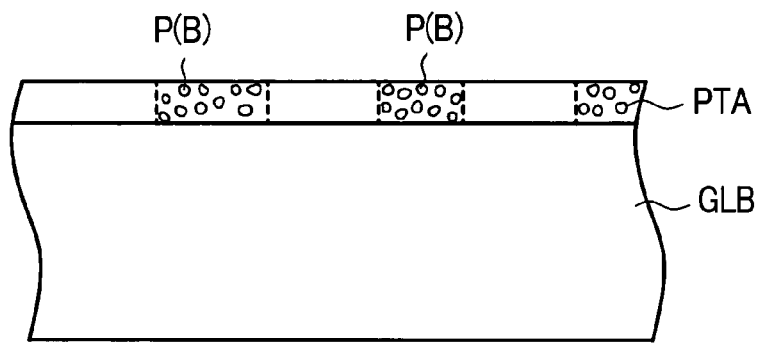

FIGS. 10A and 10B illustrate a method of forming a reflection pattern PTN, as shown in FIGS. 9A and 9B. First of all, a chloroform dispersion having dissolved therein soluble pigments of substituent-modified Quinacridon Red and Phthalocyanine Blue, as indicated in Table 1, is coated on the back face of the light guiding plate GLB and then dried to form a coating film PTA. This coating film PTA is exposed to light from a 20-mW xenon (Xe) lamp through an opening-provided mask MK formed with a prescribed gradation (see FIG. 10A). Thus, the respective soluble pigment (modified dyestuff molecule) exposed with an intensity corresponding to the size of the opening OPN of the mask MK is converted to an insoluble pigment (dyestuff molecule from which the substituent has been eliminated). Thereafter, the soluble pigment remaining in the thin film is washed away using a 2.5% tetramethylammonium hydroxide solution, to obtain reflection dots P(B) having a prescribed size, as shown in FIG. 10B.

Incidentally, it is also possible to provide the light guiding plate itself with a gradation represented by the reflection pattern PTN, as shown in FIG. 9A (modulation of the pattern size from the left end towards the right end). That is, chloroform dispersions each having dissolved therein the soluble pigments of substituent-modified Quinacridon Red and Phthalocyanine Blue, as indicated in Table 1, are prepared and added in an acrylic resin in a molten state as a substrate of the light guiding plate GLB in an amount of 0.1% and 0.01%, respectively, followed by stirring for one day, thereby uniformly dispersing the pigment in the acrylic resin. The resulting dispersion is poured and cast in a mold of the light guiding plate. A YAG laser having a beam diameter of 1 mmφ and an output of 200 mW emits light that is irradiated on both sides of the light guiding plate, while keeping the surrounding temperature and the light guiding plate temperature at 0° C. The laser is irradiated in such a manner that irradiation is conducted while scanning the surface of the resin poured into the mold of the light guiding plate reciprocally along a path of U-shape from one end to the other end with a scanning speed which is gradually slowed. Thus, the temperature distribution in the vertical direction (thickness direction) of the light guiding plate varies corresponding to the scanning speed, and the ratio of conversion of the soluble pigment to the insoluble pigment also varies corresponding thereto.

According to the feature of this Embodiment, the degree of scattering in the light guiding plate GLB is determined by a scattering distance regardless of the shape of the scatter to be defined according to the Debye scatter theory. Therefore, according to the feature of this Embodiment, since the degree of scattering can be freely controlled, it becomes possible to prepare an ideal light guiding plate. That is, it is not required to print white dots having scattering reflection characteristics which are the same as in the conventional technologies on the lower surface of the light guiding plate, and it is possible to realize a light guiding plate that is capable of producing a uniform outgoing radiation over the entire surface of the light guiding plate. According to basic experiments for this Embodiment, the pigment grain size was not larger than 50 nm in the existing concentration of the organic pigment of 5% or less, and a mean grain size of from 50 nm to 100 nm was obtained in the concentration of from 5 to 8% and a mean grain size of from 100 nm to 400 nm in the concentration of 10% or more was obtained, respectively.

EMBODIMENT 6

Example of Application to Optical System of a Projection Liquid Crystal Display:

One example of a method of adding a coloring agent to a micro lens to be used in an optical system of a projection liquid crystal display using a liquid crystal display panel in an image-forming device will be described below. A fluorine series water repellent that is capable of freely controlling water repellency by light is coated on a transparent substrate, such as glass and an acrylic resin plate, which is then irradiated with light through a shadow mask having plural fine pores corresponding to the dot shape. A hydrophilic or hydrophobic pattern is formed on the coating film of the fluorine series water repellent. The resulting substrate is dipped in the quinacridon pigment liquid prepared in accordance with the foregoing Embodiment 1, and it is then lifted up from the pigment liquid, thereby leaving the pigment liquid only in the hydrophilic group portion in the dot shape. The pigment liquid remains in the lens shape on the substrate due to its surface tension.

When the pigment liquid is cured by heat treatment at 150° C. for 30 minutes, the pigment (dyestuff molecule) dissolved in the pigment liquid causes a modification so that it is chemically stabilized. When this pigment is once stabilized, its color does not easily change by heat energy or light energy. Accordingly, even when this pigment is used in the optical system of a projection liquid crystal display in which the liquid display panel is exposed to high temperatures, the resulting pigment film does not cause discoloration. By using the thus prepared micro lens array (pigment film) in the optical system of a projection liquid crystal display, the red chromaticity of the chromaticity coordinates are changed from (0.60, 0.38) to (0.62, 0.34), and the color reproduction range of images to be projected on a screen was improved.

EMBODIMENT 7

Other Example of Application to Optical Member of a Liquid Crystal Display:

For the sake of applying the invention to an optical member constituting a liquid crystal display, another method of preparation of colloidal silica using the pigment according to the invention will be described. In a step of preparing colloidal silica, a pigment dissolved in an organic solvent is added to a silica solution to prepare colored colloidal silica. First of all, an alkali silicate (water glass) is diluted with pure water, brought into contact with an H type cationic exchange resin, made strongly acidic by the addition of an acid, and then again brought into contact with an H type cationic exchange resin. Here, the chloroform solution, having dissolved therein the Phthalocyanine Blue (modified phthalocyanine), as described in the foregoing Embodiment 1, and the other solution are added such that the pH does not change. Thereafter, heating is conducted to grow the grains, thereby converting the pigment to an insolubilized pigment and obtaining microcapsule type colloidal silica having a structure in which the pigment molecule is taken in the $SiO_2$ grains.

Needless to say, this colloidal silica can be used for the same applications as considered in the foregoing Embodiment 5. Besides, for example, the colloidal silica can be added in a diffusing sheet. The blue colloidal silica prepared in accordance with the foregoing method is added in an acrylic resin such that its concentration is 1% by weight. This liquid is subjected to film formation into a thin film having a thickness of 50 μm using a rod coater, which is then heated at 120° C. for 30 minutes, thereby insolubilizing the Phthalocyanine Blue. Characteristics of the thus prepared diffusing sheet were compared with those of the conventional diffusing sheet, the results of which are shown in Table 5.

TABLE 5

Reflectance (Reflectivity) of Diffusing Sheet

| (x, y) Chromacity | Haze | Reflectance (Reflectivity) of diffusing plate: (a*, b*) |
|---|---|---|
| Invention | 90% | (+1.05, −8.78) |
| Conventional Example | 92% | (+1.05, +10.58) |

EMBODIMENT 8

Another Example of Application to Cathode Ray Tube:

Polymerization was conducted by continuous dropwise addition of 0.1% of sodium dodecylbenzenesulfonate, 5% of methacrylic acid, 20% of ethyl methacrylate, and a catalyst to pure water at a water temperature of 60° C. To the thus obtained polymer aqueous solution, a chloroform solution (pigment solution) having dissolved therein the substituent-modified Quinacridon Red and Phthalocyanine Blue, as indicated in Table 1, in a mixing ratio of 4/1, was added. The pigment solution prepared by dissolving the two kinds of dyestuff molecules in chloroform was gradually added to the foregoing aqueous solution, such that the total concentration of the dyestuff molecules (pigments) in the polymer aqueous solution was 0.5%. The mixture was well stirred and then allowed to stand at 160° C. for 60 seconds. Thereafter, the resulting liquid was filtered, washed, and then dried to obtain polyacrylic series colored resin beads having a mean grain size of 5 μm.

The acrylic beads are dispersed in a tackifier of a polyethylene terephthalate (PET) film for surface treatment of a cathode ray tube to obtain a film for surface treatment having wavelength selective absorption properties. According to the conventional dispersion technologies in the state of an insoluble pigment, it was impossible to add the pigment in a high concentration because of the occurrence of scattering. Characteristics of the panel surface of the flat panel cathode ray tube in the case of using the film of this Embodiment were compared with those of the conventional film, the results of which are shown in Table 6.

TABLE 6

Comparison of Surface Performance of Cathode Ray Tube using PET Film

|  | Haze | Luminance (Relative Ratio) | Contrast | External tint |
|---|---|---|---|---|
| Invention | 0.2% | 100 | 1.10 | Dark purple |
| Conventional Example | 0.5% | 100 | 1.01 | Black |

Incidentally, besides the foregoing examples, it is possible to impart wavelength selective absorption properties by adding a wavelength selective absorption imparting agent in the tackifier of the antireflection film for a PDP device or in the tackifier of liquid crystal display panel or polarizing plate of an OLED device.

EMBODIMENT 9

Figure 11:
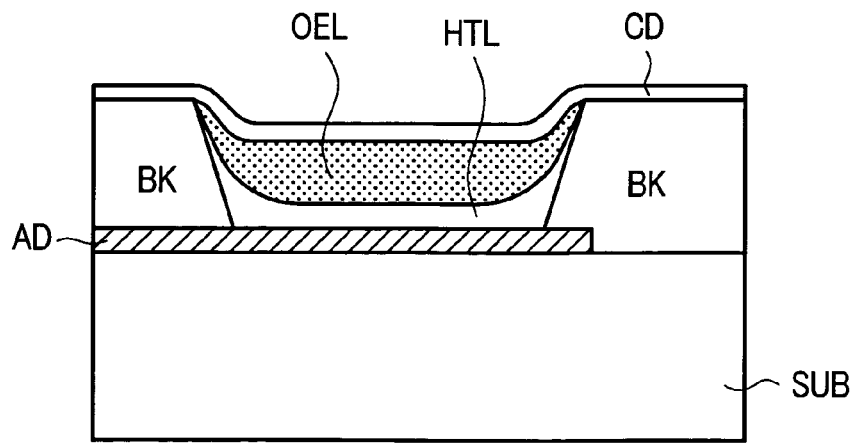
FIG. 11 is a sectional view schematically showing the outline of a structure of one pixel of an OLED display device.

Example of Application to OLED:

FIG. 11 is a sectional view showing an outline of the structure of one pixel of an OLED display device. This OLED display device has a thin film transistor on a glass substrate SUB and an anode AD to be driven by this thin film transistor, a luminescent material layer OEL is filled in the concave portion surrounded by a bank BK composed of a dielectric layer formed thereon; and a cathode CD is further provided thereon by film formation. First all, an aluminum quinolinol complex was dissolved in chloroform to prepare a 0.1% by weight solution. Also, the substituent-modified Quinacridon Red that is soluble in chloroform, as indicated in Table 1, was similarly dissolved in chloroform to prepare a 0.1% by weight solution. These chloroform solutions were mixed in a weight ratio of the former to the latter of 100/0.5 and stirred to evaporate off the chloroform. Several tens of milligrams of the thus obtained aluminum quinolinol complex and modified Quinacridon Red were charged in a molybdenum crucible.

On the other hand, as shown in FIG. 11, the glass substrate SUB having an ITO (indium-tin oxide) film as the anode AD, the dielectric film BK called a bank layer, which covers the marginal upper surface of the ITO film, and a hole transfer layer HTL formed on the upper surface of the ITO film to be exposed from an opening of the dielectric film BK is prepared. The opening of the dielectric film BK is formed corresponding to each of plural pixels to constitute a display screen of the OLED display device. In the case where the OLED display device is subjected to active matrix driving, a laminate structure is formed containing a switching element, such as a thin film transistor, and a signal line for driving it between the glass substrate SUB and the anode AD.

This glass substrate SUB is aligned such that the hole transfer layer HTL is opposed to the molybdenum crucible. Next, the temperature (port temperature) of the molybdenum crucible is raised to 330° C. to sublimate the aluminum quinolinol complex and Quinacridon Red in the crucible at an evaporation rate of 1 angstrom/sec, thereby vapor depositing them to a thickness of about 60 nm on the upper surface of the hole transfer layer HTL. There is thus formed a luminescent material layer OEL. Ultimately, on the vapor deposition layer (luminescent material layer OEL) containing the aluminum quinolinol complex and Quinacridon Red, 1 nm of LiF (lithium fluoride) and 250 nm of Al (aluminum) are subjected to film formation in that order to form the cathode CD, thereby completing an organic EL element. The foregoing aluminum quinolinol complex is a representative electroluminescent material and is often designated as $Alq_3$ (abbreviation of tri(8-hydroxyquinoline) aluminum).

When the organic EL element provided with the foregoing luminescent material layer containing $Alq_3$ and Quinacridon Red was excited at a voltage of 8 V and a current of 100 μA, the luminous peak wavelength was shifted from 520 nm to 540 nm, and the luminance was increased by about 2 times, as compared with an organic EL element (comparative sample) provided with a luminescent material layer formed of only $Alq_3$ (aluminum quinolinol complex) that has been excited under the same conditions. It is estimated that this phenomenon occurred for the reason that the soluble molecule of Quinacridon Red was uniformly mixed in the chloroform solution and became to be in the ultrafine grain state by heating upon vapor deposition. Also, since the substituent-modified Quinacridon Red recovers the original molecular structure (molecule insoluble in chloroform before the modification) by heating upon vapor deposition, the optical absorption characteristics of the original quinacridon was reproduced in the luminescent material. In this Embodiment, since the two kinds of substances to be vapor deposited jointly, while precisely controlling the vapor deposition temperature and vapor deposition rate that are originally different from each other, can be handled as a single substance, the process of manufacture can be greatly simplified.

EMBODIMENT 10

Example of Application to High-Molecular OLED Device:

A chloroform solution containing 1% of poly-N-vinylcarbazole (PVK) as a high-molecular organic EL luminescent material was mixed with a chloroform solution containing 0.1% of the substituent-modified Quinacridon Red, as indicated in Table 1, and the mixture was spin coated on the anode AD (ITO film) formed on the glass substrate, as shown in FIG. 11. In the OLED display device using, as an organic material that is capable of forming the luminescent material layer, a so-called high-molecular material having a molecular weight that is higher than that of the foregoing Embodiment 9, there may be the case where it is not necessary to form the hole transfer layer HTL on the point of characteristics of the organic material. Incidentally, the OLED display device of the foregoing Embodiment 9 may be called an OLED (organic light emitting diode) in the narrow sense, whereas that of this Embodiment may be called a PLED (polymer light emitting diode). Also, in this Embodiment, an inkjet process may be employed in coating the chloroform solution containing the luminescent material and the modified quinacridon on the anode AD.

After coating the luminescent material and the modified quinacridon on the anode AD, the entire surface of the substrate was irradiated with light from an argon laser at 10 W for 60 seconds to eliminate the substituent from the modified quinacridon, thereby forming the luminescent material layer OEL. On this luminescent material layer OEL, LiF (lithium fluoride) and Al (aluminum) were subjected to vacuum vapor deposition in that order to form the cathode CD, thereby completing a high-molecular organic EL element. The completed element contained quinacridon (Quinacridon Red) as a dopant in the luminescent material layer OEL containing poly-N-vinylcarbazole as the major component. The OLED display device of this Embodiment, in which the dopant of pigment was contained in the luminescent material layer OEL, had a luminous efficiency of about 0.9 times as compared with a dopant-free OLED display device. However, with respect to the life of the OLED display device, as defined by a time when the luminance becomes ½ of the initial value, the OLED display device of this Embodiment had a life of 10 times that of the dopant-free OLED display device. Thus, it was noted that the OLED display device of this Embodiment has an advantage in that the practically useful display luminance can be obtained for a long period of time and more stably.

According to this Embodiment, the substrate on which the luminescent material layer OEL is formed is irradiated with energy to eliminate the soluble substituent from Quinacridon Red contained in the luminescent material layer OEL. For that reason, the quinacridon molecule (modified dyestuff molecule) constituting a dye in the dissolved state in chloroform is deposited from chloroform and aggregated, and the mutual action generated between the molecules reduces the luminous efficiency in the luminescent material layer even slightly. However, the aggregated quinacridon molecule (dyestuff molecule from which the substituent has left) accepts the foregoing energy in the luminescent material layer, thereby to start polymerization. The degree of polymerization is controlled by the amount of energy to be irradiated. The polymerization of the dyestuff molecule (quinacridon molecule in this Embodiment) in the luminescent material layer chemically stabilizes the co-existing luminescent material (poly-N-vinylcarbazole in this Embodiment), thereby suppressing a rapid reduction of the luminous efficiency. The dyestuff molecule polymerized in the luminescent material layer is dispersed as, for example, nanofine grains of pigment (pigment grains having a grain size of not larger than 70 nm) in the luminescent material. Also, when a dyestuff molecule of pigment having excellent light fastness is used, a bias of the amount of electrons or holes to be injected in the luminescent material layer and degradation of the luminescent material itself by light emission of excessive wavelength bands from the luminescent material are inhibited. Further, in the case of using a high-molecular luminescent material, polymerization of the luminescent material itself proceeds in response to the foregoing energy irradiation so that its chemical stability is further improved. Accordingly, in the overall OLED display device, the display luminance becomes stable, and the life is largely prolonged.

Also, even though the luminescent material is of a low molecular weight, as in the foregoing Embodiment 9, by adding a pigment having a HOMO-LUMO level close to luminescent materials (such as host materials, low-molecular $Alq_3$, and high-molecular PVK) as a dopant (guest material) in the luminescent material layer OEL, the luminescent material is stabilized, and the life of the OLED display device is prolonged. In that case, it is important to dissolve the soluble dyestuff (dye type variant) obtained by introducing a substituent into the dyestuff molecule in a solvent together with the luminescent material and to precisely control the energy to be irradiated thereto.

As described previously, according to the invention, by reducing the solubility of a dyestuff molecule in a solvent or binder upon energy transfer, it is possible to control aggregation of dyestuff molecules caused thereby to form a pigment having a desired grain size. Also, the rate of converting a dyestuff molecule soluble in a solvent or binder to an insoluble dyestuff molecule can be controlled, depending upon the energy transfer conditions. Accordingly, the surface treatment, coloring (tint control), refractive index and wavelength selectivity of a functional film to be formed on a display device or an optical element to be provided thereon are adjusted to the desired state by controlling the grain size of the pigment, whereby the function of the overall display device is markedly improved.

The invention claimed is:

1. A display device comprising:
an optical region which consists of a plurality of first parts each formed of a plurality of dyestuff molecules which are aggregated thereat and a second part including derivatives of at least a respective one of the dyestuff molecules,
wherein the derivatives of the dyestuff molecules are soluble in a solvent in which the at least respective one of the dyestuff molecules itself is insoluble.

2. The display device according to claim 1, wherein the solvent is a hydrophobic organic solvent.

3. The display device according to claim 1, wherein the solvent is cured to be utilized for a binder material of the optical region, the plurality of first parts are distributed in the solvent being cured, while the derivatives of the dyestuff molecules are dissolved therein in the second part.

4. The display device according to claim 1, wherein the derivatives of the dyestuff molecules are converted to the dyestuff molecules by transferring energy thereto.

5. The display device according to claim 4, wherein energy is transferred to the derivatives of the dyestuff molecules by at least one process selected from a group consisting of heat treatment applied to the derivatives, light irradiation thereto, electromagnetic waves irradiated thereto, plasma treatment thereof, and ion implantation applied thereto.

6. The display device according to claim 5, wherein a pattern of the plurality of first parts formed in the optical region is variable in accordance with the selection of the at least one process for transferring the energy to the derivatives of the dyestuff molecule and an amount thereof.

7. The display device according to claim 5, wherein the optical region has a principal surface and evenness of the principal surface depends on the selection of the at least one process for transferring the energy to the derivatives of the dyestuff molecules and an amount thereof.

8. The display device according to claim 1, wherein the derivatives dissolved in the second part of the optical region are classified into at least two kinds obtained by chemical modification of at least two kinds of dyestuff molecules respectively, and
the dyestuff molecules aggregated at the plurality of first parts of the optical region belong to one of the at least two kinds of dyestuff molecules.

9. The display device according to claim 1, wherein the dyestuff molecules aggregated at one group of the plurality of first parts of the optical region have a different molecular structure from those of the rest of the dyestuff molecules aggregated at another group of the plurality of first parts.

10. The display device according to claim 1, wherein each of the dyestuff molecules has at least one nitrogen atom therein, and the derivatives are obtained through chemical modification of the dyestuff molecules by combining a substituent to the at least one nitrogen atom belonging thereto.

11. The display device according to claim 1, wherein the optical region is provided as a functional film having a principal plane for the display device.

12. The display device according to claim 11, wherein the plurality of first parts are distributed in the principal plane of the optical region, and respective sizes of the plurality of first parts are varied gradually along a direction extended from one side of the principal plane to another side thereof opposite to the one side thereof.

13. The display device according to claim 1, wherein the optical region is an optical component assembled in the display device and has a principal surface transverse to an optical path extended from the display device.

14. The display device according to claim 1, wherein each of the plurality of first parts in the optical region is shaped into a nanofine particle each having a grain size not greater than 70 nm.

* * * * *